United States Patent
Nendai

(10) Patent No.: US 8,569,763 B2
(45) Date of Patent: Oct. 29, 2013

(54) DISPLAY PANEL DEVICE AND METHOD OF MANUFACTURING THE SAME

(75) Inventor: Kenichi Nendai, Kyoto (JP)

(73) Assignee: Panasonic Corporation, Osaka (JP)

( * ) Notice: Subject to any disclaimer, the term of this patent is extended or adjusted under 35 U.S.C. 154(b) by 45 days.

(21) Appl. No.: 13/218,901

(22) Filed: Aug. 26, 2011

(65) Prior Publication Data

US 2011/0309385 A1 Dec. 22, 2011

Related U.S. Application Data

(63) Continuation of application No. PCT/JP2010/005475, filed on Sep. 7, 2010.

(30) Foreign Application Priority Data

Sep. 14, 2009 (JP) ................................. 2009-212486

(51) Int. Cl.
*H01L 31/00* (2006.01)
*H01L 21/00* (2006.01)

(52) U.S. Cl.
USPC .................. 257/59; 257/72; 438/82; 438/99; 438/128

(58) Field of Classification Search
None
See application file for complete search history.

(56) References Cited

U.S. PATENT DOCUMENTS

| 7,097,662 B2* | 8/2006 | Evans et al. ................. 623/18.11 |
| 7,338,844 B2* | 3/2008 | Ozawa et al. ................. 438/149 |
| 7,754,275 B2* | 7/2010 | Mitsuhashi et al. ............ 427/66 |
| 7,791,267 B2 | 9/2010 | Baek et al. |
| 2007/0269621 A1 | 11/2007 | Mitsuhashi et al. |
| 2008/0067932 A1 | 3/2008 | Baek et al. |
| 2009/0195151 A1 | 8/2009 | Nagayama et al. |

FOREIGN PATENT DOCUMENTS

| JP | 2005-197027 | 7/2005 |
| JP | 2006-134624 | 5/2006 |
| JP | 2007-123286 | 5/2007 |
| JP | 2007-311237 | 11/2007 |
| JP | 2008-072078 | 3/2008 |
| JP | 2009-181836 | 8/2009 |

OTHER PUBLICATIONS

International Search Report of PCT/JP010/005475, dated Nov. 2, 2010.

* cited by examiner

*Primary Examiner* — Alonzo Chambliss
(74) *Attorney, Agent, or Firm* — Greenblum & Bernstein, P.L.C.

(57) ABSTRACT

A display panel device having a structure that is more reliable than that of a conventional display panel device includes: a bank and an opening surrounded by an inclined side wall of the bank; a pixel electrode that is a first electrode layer formed on the opening of the bank; a hole injection layer and an organic EL layer that are organic functional layers formed on the first electrode layer; and a common electrode that is a second electrode layer formed on the organic functional layers, wherein the first electrode layer has (i) an end portion that is in contact with the side wall of the bank so that the end portion runs on the side wall, and (ii) a depressed portion that opens upward in a peripheral portion close to the end portion.

22 Claims, 9 Drawing Sheets

DISPLAY PANEL DEVICE AND METHOD OF MANUFACTURING THE SAME

CROSS REFERENCE TO RELATED APPLICATION

This is a continuation application of PCT application No. PCT/JP2010/005475 filed on Sep. 7, 2010, designating the United States of America.

BACKGROUND OF THE INVENTION (1) Field of the Invention

The present invention relates to a display panel device and a method of manufacturing the same, and in particular to an organic electroluminescence (EL) display panel device.

(2) Description of the Related Art

The organic EL panel devices are luminescent display panel devices using electroluminescence phenomena generated from organic compounds, and have been practically used as small-sized display panel devices, such as those for mobile phones.

Each of the organic EL panel devices includes, on a substrate, an array of organic EL elements capable of controlling a luminescence separately for each pixel.

Typically, each of the organic EL panel devices includes, on a substrate, a controller, a pixel electrode separate for each pixel (for example, anode), an organic functional layer, and a common electrode (for example, cathode). The organic functional layer includes at least an organic EL layer made of an organic compound, and may include at least one of functional layers to be stacked on the organic functional layer. The functional layers include an electron injection layer, an electron transport layer, a hole transport layer, and a hole injection layer.

The organic EL panel device having such a structure produces a luminescence through injection of charges into the organic EL layer through the anode, the cathode, the hole injection layer, and the electron transport layer, and recombination of the injected charges in the organic EL layer.

For example, Japanese Unexamined Patent Application Publications No. 2007-123286 (hereinafter referred to as Patent Reference 1) and No. 2008-72078 (hereinafter referred to as Patent Reference 2) disclose such organic EL display panel devices.

FIG. 8A illustrates a cross section of main portions of an organic EL display device 800 disclosed in Patent Reference 1. The organic EL display device 800 includes a substrate 801, a driving transistor 802, an insulation layer 803, a pixel electrode 804, a bank layer 805, a luminescence material layer 806, and a facing electrode 807.

FIG. 8B illustrates a cross section of main portions of an organic EL display device 900 disclosed in Patent Reference 2. The organic EL display device 900 includes a substrate 901, a thin-film transistor 902, a planarizing layer 903, a first pixel electrode 904, a pixel control layer 905, an organic EL layer 906, and a second pixel electrode 907.

Each of the bank layer 805 of the organic EL display device 800 and the pixel control layer 905 of the organic EL display device 900 has an opening on a favorable area of each of the pixel electrodes, and functions as a bank for defining a luminescent area of each of the pixels. Here, the opening is made of an insulating material.

However, it is known that in a conventional organic EL display panel device, the luminescence function is lost in proximity of a peripheral portion of the opening of a bank, such as that of the bank layer 805 or the pixel control layer 905, and a defect (degradation in pixel) resulting in reduction in a luminescent area occurs.

FIGS. 9A to 9C illustrate the processes of occurrence of such a defect in a conventional organic EL display panel device, using an example of a simplified organic EL element 700.

When the organic EL element 700 is manufactured, a pixel electrode 704 (the pixel electrode 804 and the first pixel electrode 904) is formed by (i) forming a thin layer 704A, such as a metal layer, on an entire surface of a substrate 701 using a thin film formation method, for example, the sputtering method, and (ii) eliminating an unnecessary portion of the thin layer 704A by an etching process using a resist 704M as a mask, thus leaving only a necessary portion of the thin layer 704A, as illustrated in FIG. 9A.

However, when the pixel electrode 704 is formed by a wet etching process, depressed portions each of which is a lateral opening are formed at the end faces of the pixel electrode 704 with the etching solution entering the side of the pixel electrode 704, as illustrated in FIG. 9B. When a bank 705 (the bank layer 805 and the pixel control layer 905) is stacked on the pixel electrode 704 using the thin film formation method, such as a sputtering method and a wet process in the aforementioned state, the depressed portions become closed hollows 708.

The air and moisture accumulated in the hollow 708 enter, in particular, an organic EL layer 706 in the resulting organic EL element 700 as indicated by arrows 709, thus causing degradation in the organic EL layer 706 and in the device characteristics, or deterioration in the life of the device, as illustrated in FIG. 9C.

The present invention has been conceived to solve the problems, and has an object of providing a display panel device with reliability higher than conventional devices, and a method of manufacturing the same.

SUMMARY OF THE INVENTION

In order to solve the problems, the display panel device according to an aspect of the present invention is a display panel device including: a bank and an opening surrounded by an inclined side wall of the bank; a first electrode layer formed on the opening of the bank; an organic functional layer formed on the first electrode layer; and a second electrode layer formed on the organic functional layer, wherein the first electrode layer has (i) an end portion that is in contact with the side wall of the bank so that the end portion runs on the side wall, and (ii) a depressed portion that opens upward in a peripheral portion close to the end portion.

In the display panel device according to the aspect of the present invention, the first electrode layer has a depressed portion that opens upward in a peripheral portion close to the end portion that is in contact with the side wall of the bank.

Even when an ink that is a raw material of a charge injection layer, a luminescent layer, and others is applied on the first electrode layer in the state, the ink enters the depressed portions that open upward in the peripheral portion of the first electrode layer. Thus, occurrence of a hollow can be prevented.

Alternatively, even when another thin film, such as a charge injection layer made of indium tin oxide (ITO) or a metal oxide is formed on the first electrode layer using a thin film formation method, such as a sputtering method, the thin film is formed inside of the depressed portion that opens upward in the peripheral portion of the first electrode layer. Thus, occurrence of a hollow can be prevented.

As a result, occurrence of a hollow between the first electrode layer and the organic functional layer can be prevented, the device characteristics can be stabilized, and the deterioration in the life of the device can be prevented.

FURTHER INFORMATION ABOUT TECHNICAL BACKGROUND TO THIS APPLICATION

The disclosure of Japanese Patent Application No. 2009-212486 filed on Sep. 14, 2009 including specification, drawings and claims is incorporated herein by reference in its entirety.

The disclosure of PCT application No. PCT/JP2010/005475 filed on Sep. 7, 2010, including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings:

FIGS. 3A, 3B1, 3B2 and 3C illustrate cross sections of an example of processes of manufacturing an organic EL display panel device according to Embodiment 1;

DESCRIPTION OF THE PREFERRED EMBODIMENTS

Figure 1A:
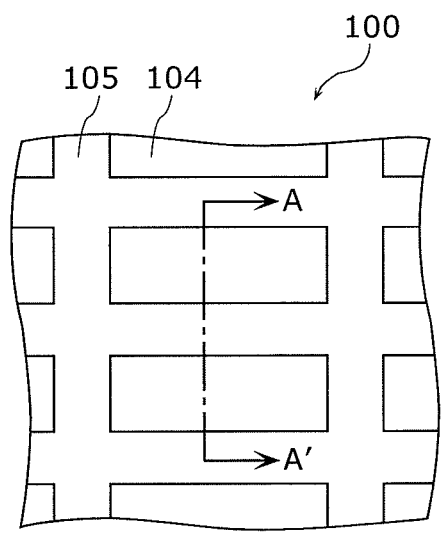
FIGS. 1A and 1B illustrate a plain view and a cross section of an example of a structure of main portions of an organic EL display panel device according to Embodiment 1.

The display panel device according to an aspect of the present invention is a display panel device including: a bank and an opening surrounded by an inclined side wall of the bank; a first electrode layer formed on the opening of the bank; an organic functional layer formed on the first electrode layer; and a second electrode layer formed on the organic functional layer, wherein the first electrode layer has (i) an end portion that is in contact with the side wall of the bank so that the end portion runs on the side wall, and (ii) a depressed portion that opens upward in a peripheral portion close to the end portion.

According to the aspect of the present invention, the first electrode layer has a depressed portion that opens upward in a peripheral portion close to the end portion that is in contact with the side wall of the bank.

Even when an ink that is a raw material of a charge injection layer, a luminescent layer, and others is applied on the first electrode layer using a printing technique in the state, the ink enters the depressed portions that open upward in the peripheral portion of the first electrode layer. Thus, occurrence of a hollow can be prevented.

Alternatively, even when another thin film, such as a charge injection layer made of ITO or a metal oxide, is formed on the first electrode layer using a thin film formation method, such as a sputtering method, the thin film is formed inside of the depressed portion that open upward in the peripheral portion of the first electrode layer. Thus, occurrence of a hollow can be prevented.

As a result, occurrence of a hollow between the first electrode layer and the organic functional layer can be prevented, the device characteristics can be stabilized, and the deterioration in the life of the device can be prevented.

Furthermore, in the display panel device according to an aspect of the present invention, the depressed portion that opens upward in the peripheral portion of the first electrode layer may be covered with the organic functional layer formed on the first electrode layer.

According to the aspect of the present invention, the depressed portion that opens upward in the peripheral portion of the first electrode layer may be covered with the organic functional layer.

Thereby, even when the peripheral portion of the first electrode layer is depressed inside by etching, the depressed portion in the peripheral portion of the first electrode layer opens upward. When an organic functional layer is formed above the first electrode layer, the organic functional layer is formed inside the depressed portion that opens upward in the peripheral portion of the first electrode layer.

As a result, occurrence of a hollow between the first electrode layer and the organic functional layer can be prevented, the device characteristics can be stabilized, and the deterioration in the life of the device can be prevented.

The display panel device according to an aspect of the present invention may include a transparent conductive layer interposed between the first electrode layer and the organic functional layer, the transparent conductive layer preventing oxidation of the first electrode layer, wherein the depressed portion that opens upward in the peripheral portion of the first electrode layer may be covered with the transparent conductive layer.

According to the aspect of the present invention, the depressed portion that opens upward in the peripheral portion of the first electrode layer may be covered with the transparent conductive layer.

Thereby, even when the peripheral portion of the first electrode layer is depressed inside by etching, the depressed portion in the peripheral portion of the first electrode layer opens upward. When a transparent conductive layer is formed on the first electrode layer, the transparent conductive layer is formed inside the depressed portion that opens upward in the peripheral portion of the first electrode layer.

As a result, occurrence of a hollow between the first electrode layer and the transparent conductive layer can be prevented, the device characteristics can be stabilized, and the deterioration in the life of the device can be prevented.

Moreover, in the display panel device according to an aspect of the present invention, the organic functional layer may include an organic electroluminescence (EL) layer.

According to the aspect of the present invention, the organic functional layer may include an organic EL layer.

Moreover, in the display panel device according to an aspect of the present invention, the first electrode layer may be a metal anode layer, the second electrode layer may be a metal cathode layer, and the organic functional layer may include an organic EL layer and a hole injection layer.

According to the aspect of the present invention, the first electrode layer may be a metal anode layer, the second electrode layer may be a metal cathode layer, the organic functional layer may include an organic EL layer and a hole injection layer that injects holes from the metal anode layer into the organic EL layer.

Thereby, the hole injection characteristics for the organic luminescent layer can be improved, and a display panel device with superior luminescence characteristics even at a low voltage can be manufactured.

Moreover, in the display panel device according to an aspect of the present invention, the first electrode layer may be a metal anode layer, the second electrode layer may be a metal cathode layer, and the organic functional layer may include an organic EL layer, a hole transport layer, and a hole injection layer.

According to the aspect of the present invention, the first electrode layer may be a metal anode layer, the second electrode layer may be a metal cathode layer, and the organic functional layer may include an organic EL layer, a hole transport layer, and a hole injection layer.

Thereby, the hole injection characteristics for the organic luminescent layer can be improved, and a display panel device with superior luminescence characteristics even at a low voltage can be manufactured.

Moreover, the display panel device according to an aspect of the present invention may further include: a thin-film transistor layer that includes a driving transistor and is located below the first electrode layer, the driving transistor causing an organic EL layer included in the organic functional layer to produce a luminescence with application of a current between the first electrode layer and the second electrode layer; and a planarizing layer located between the organic EL layer and the thin-film transistor layer to planarize an interface between the organic EL layer and the thin-film transistor layer.

The display panel device according to an aspect of the present invention may further include a planarizing layer located between the organic EL layer and the thin-film transistor layer to planarize an interface between the organic EL layer and the thin-film transistor layer.

Moreover, in the display panel device according to an aspect of the present invention, the planarizing layer and the bank may be formed of different materials.

According to the aspect of the present invention, the planarizing layer and the bank may be formed of different materials.

Moreover, in the display panel device according to an aspect of the present invention, the planarizing layer and the bank may be formed of a same material and in a same layer.

According to the aspect of the present invention, the planarizing layer and the bank may be formed of a same material and in a same layer.

Furthermore, the display panel device according to an aspect of the present invention may be applied to a display panel apparatus.

According to the aspect, the display panel device may be applied to a display device.

Moreover, a method of manufacturing a display panel device according to an aspect of the present invention includes: forming, on a base, a bank and an opening surrounded by an inclined side wall of the bank; forming a first electrode layer from a top surface of the bank to a bottom of the opening, using a thin film formation method; patterning the first electrode layer by etching so that the first electrode layer has a depressed portion that opens upward in a peripheral portion close to an end portion of the first electrode layer, the end portion of the first electrode layer being continuously in contact with the side wall of the bank; forming a layer above the first electrode layer so as to cover the depressed portion that opens upward; and forming a second electrode layer above the first electrode layer. In the patterning, the end portion of the first electrode layer may be in contact with the side wall of the bank so as to run on the side wall.

According to the aspect of the present invention, the first electrode layer has a depressed portion that opens upward in a peripheral portion close to the end portion that is in contact with the side wall of the bank.

Even when an ink that is a raw material of a charge injection layer, a luminescent layer, and others is applied on the first electrode layer using a printing technique in the state, the ink enters the depressed portions that open upward in the peripheral portion of the first electrode layer. Thus, occurrence of a hollow can be prevented.

Alternatively, even when another thin film, such as a charge injection layer made of ITO or a metal oxide, is formed on the first electrode layer using a thin film formation method, such as a sputtering method, the thin film is formed inside of the depressed portion that opens upward in the peripheral portion of the first electrode layer. Thus, occurrence of a hollow can be prevented.

As a result, occurrence of a hollow between the first electrode layer and the organic functional layer can be prevented, the device characteristics can be stabilized, and the deterioration in the life of the device can be prevented.

Moreover, in the method of manufacturing a display panel device according to an aspect of the present invention, in the forming of a layer, the layer formed above the first electrode layer may have an area larger than an area of the first electrode layer, and may cover the depressed portion that opens upward in the peripheral portion of the first electrode layer.

According to the aspect, when a transparent conductive layer, for example, made of ITO is formed on the first electrode layer that functions as an anode in order to improve the efficiency to extract light by adjustment of cavities, the transparent conductive layer is stacked on the end portion of the first electrode layer that is depressed inside. As a result, occurrence of a hollow between the first electrode layer and the organic functional layer can be prevented, the device characteristics can be stabilized, and the deterioration in the life of the device can be prevented.

Furthermore, since the layer is formed to be larger than the area of the first electrode layer, the accuracy requirement for positioning a mask for etching can be relaxed when the first electrode layer is patterned. As a result, the yield and productivity of manufacturing display panels can be increased.

In the method of manufacturing a display panel device according to an aspect of the present invention, in the forming of a layer, the layer covering the depressed portion of the first electrode layer may be an organic functional layer.

In such a case, a transparent conductive layer may be formed on the first electrode layer after the forming of a first electrode layer and before the patterning, and in the patterning, a resist may be applied by photolithography at a predetermined position of the transparent conductive layer, the transparent conductive layer may be patterned by first etching using the resist as a mask, and the first electrode layer may be further patterned by second etching using the resist as the mask.

In the method of manufacturing a display panel device according to an aspect of the present invention, in the forming of a layer, the layer covering the depressed portion of the first electrode layer may be a transparent conductive layer that prevents oxidation of the first electrode layer, and the method may further include forming an organic functional layer between the transparent conductive layer and the second electrode layer.

In such a case, in the patterning, a first resist may be applied by photolithography at a predetermined position of the first electrode layer, and the first electrode layer may be patterned using the first resist as a mask, and in the forming of a layer, the first resist may be removed, the transparent conductive layer may be formed so as to cover the patterned first electrode layer, a second resist may be applied by photolithography at a predetermined position of the transparent conductive layer, and the transparent conductive layer may be patterned by etching using the second resist as a mask.

In the method of manufacturing a display panel device according to an aspect of the present invention, the forming of a first electrode layer and the patterning may be performed in a same process, and a planarizing layer and the bank may be formed of a same material and in a same layer.

According to the aspect of the present invention, the forming of a first electrode layer and the patterning may be performed in a same process, and a planarizing layer and the bank may be formed of a same material and in a same layer. Since the bank can be formed together with the planarizing layer, the manufacturing processes can be simplified, the yield can be increased, and costs can be reduced.

Furthermore, coefficients of thermal expansion and physical characteristics, such as a glass-transition point, can be made identical between the planarizing layer and the bank, since they are formed of the same material (same kind of organic material). Thereby, compared with the case where the planarizing layer and the bank are formed of different materials, a thermal curing process can be performed on a single material for both the planarizing layer and the bank at once.

In other words, it is possible to avoid the negative influence that the planarizing layer that has been once thermally cured is again thermally cured and shrunk due to the thermal curing process in the bank and that thermal strain occurs in a thin-film transistor, resulting in the change in characteristics.

In the method of manufacturing a display panel device according to an aspect of the present invention, the thin film formation method may be a sputtering method.

According to the aspect of the present invention, the thin film formation method may be a sputtering method.

In the method of manufacturing a display panel device according to an aspect of the present invention, the first electrode layer may be a metal anode layer, the second electrode layer may be a metal cathode layer, the organic functional layer may include an organic EL layer and a hole injection layer that injects holes from the metal anode layer into the organic EL layer, and the hole injection layer may be formed using the thin film formation method, and the organic EL layer may be formed by applying an organic material using an ink jet method.

According to the aspect of the present invention, the hole injection layer may be formed using the thin film formation method, and the organic EL layer may be formed by applying an organic material using an ink jet method.

A display panel device, a method of manufacturing the same, and a display device using the same according to the present invention will be hereinafter described with reference to drawings.

Embodiment 1

First, an organic EL display panel device, a method of manufacturing the same, and a display device using the same according to Embodiment 1 will be described.

(Structure of Organic EL Display Panel Device)

FIG. 1A is a plain view illustrating an example of a structure of main portions of an organic EL display panel device 100 according to Embodiment 1. The organic EL display panel device 100 is an example of a display panel device according to the present invention.

Figure 1B:
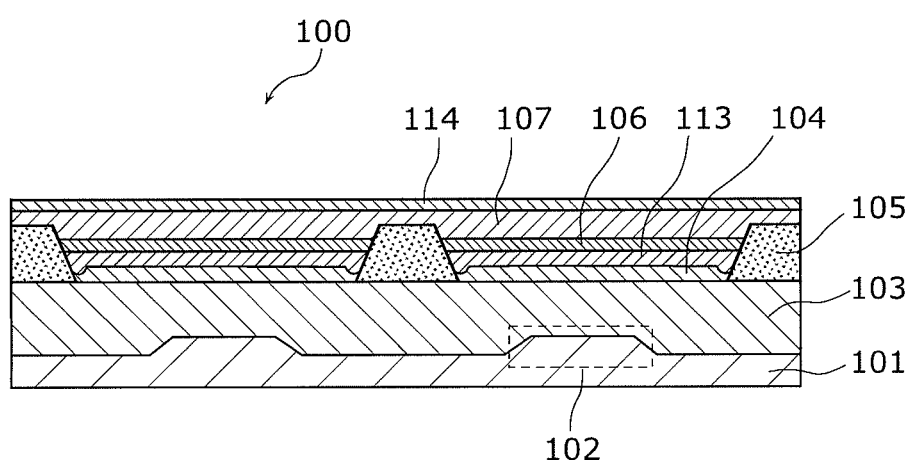

FIG. 1B illustrates a cross section of a cut surface of the organic EL display panel device 100 along the line A-A' in FIG. 1A.

The organic EL display panel device 100 includes, on a base that is not illustrated, stacked layers of a thin-film transistor layer 101, a driving transistor 102, a planarizing layer 103, a pixel electrode 104, a hole injection layer 113, a bank 105, an organic EL layer 106, a common electrode 107, and a sealing layer 114.

Here, the pixel electrode 104 is an example of the first electrode layer according to the present invention, and is used as a metal anode layer. Here, the common electrode 107 is an example of the second electrode layer according to the present invention, and is used as a metal cathode layer. Furthermore, a stack of the hole injection layer 113 and the organic EL layer 106 is an example of an organic functional layer according to the present invention.

The driving transistor 102 applies a current between the pixel electrode 104 and the common electrode 107 to cause the organic EL layer 106 to produce a luminescence. Here, the driving transistor 102 is a known thin-film transistor, and the detailed illustration is omitted.

An opening surrounded by an inclined side wall of the bank 105 is provided for each corresponding pixel.

The pixel electrode 104 has distinctive depressed portions each of which opens upward in a periphery portion close to an end portion of the pixel electrode 104 that is in contact with the side wall of the bank 105.

The depressed portions of the pixel electrode 104 are formed when the pixel electrode 104 is formed by etching a metal layer located from the top surface of the bank 105 to the bottom of the opening. The depressed portions are covered with the hole injection layer 113 on the top surface of the pixel electrode 104.

Since unlike the conventional technique, such a structure prevents formation of depressed portions that laterally open, at the end faces of the pixel electrode 104, a hollow causing a defect is hardly formed.

(Method of Manufacturing Organic EL Display Panel Device)

Next, a method of manufacturing the display panel device according to the present invention will be described. The method is characterized by including a process of forming a pixel electrode having the aforementioned depressed portions.

The method of manufacturing the display panel device according to Embodiment 1 of the present invention will be hereinafter described in detail with reference to drawings.

FIG. 2 is a process cross section view illustrating an example of a method of manufacturing the organic EL display panel device 100 according to Embodiment 1. The method of manufacturing the organic EL display panel device 100 is an example of a method of manufacturing a display panel device according to the present invention.

Since each process hereinafter can be performed using a general process technique, detailed description of the process conditions will be appropriately omitted. Furthermore, materials and processes to be described are one typical example, and do not limit the display panel device and the manufacturing method according to the present invention. The present invention also includes a case where other materials and processes whose suitability is known are used instead.

Figure 2A:
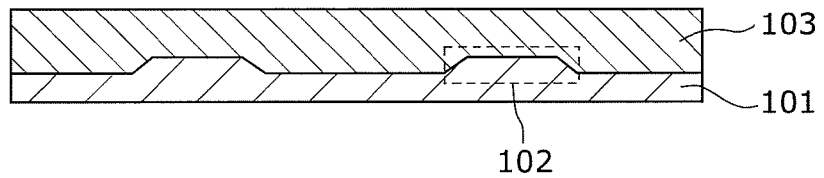
FIGS. 2A to 2F illustrate cross sections of an example of processes of manufacturing an organic EL display panel device according to Embodiment 1.

First, the thin-film transistor layer 101 including the driving transistor 102 is formed on the base that is not illustrated, and the planarizing layer 103 is formed entirely on a top surface of the thin-film transistor layer 101 as illustrated in FIG. 2A. The planarizing layer 103 is made of an insulating inorganic material, such as silicon nitride (SiN) and Si oxide ($SiO_x$), or an insulating organic material, such as acrylic, polyimide, and sol-gel.

Figure 2B:
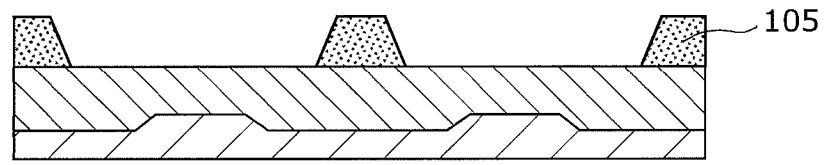

The bank 105 is formed on the planarizing layer 103 as illustrated in FIG. 2B. The bank 105 is made of an insulating inorganic material, such as SiN and $SiO_x$, or an insulating organic material, such as acrylic, polyimide, and sol-gel. The opening of the bank 105 is formed by etching or photolithography.

The planarizing layer 103 and the bank 105 may be formed of the same material in the same process, or formed of different materials in different processes.

Figure 2C:
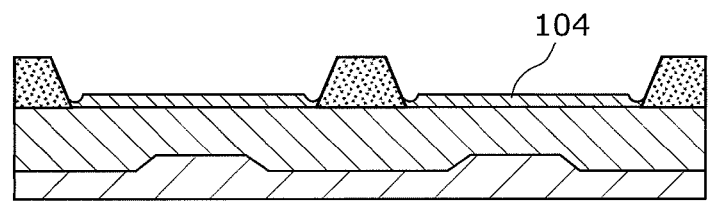

The pixel electrode 104 is formed on the opening of the bank 105 as illustrated in FIG. 2C. Hereinafter, a method of forming the pixel electrode 104 will be described in detail.

Figure 3A:
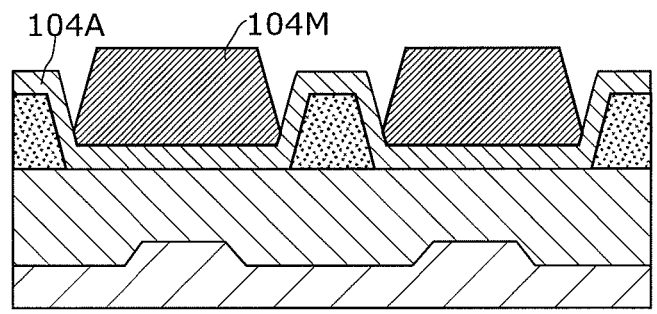
Figure 3A:
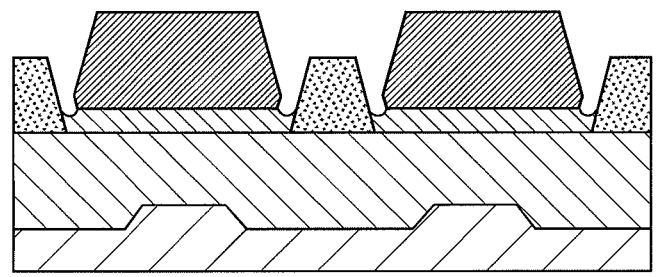
Figure 3A:
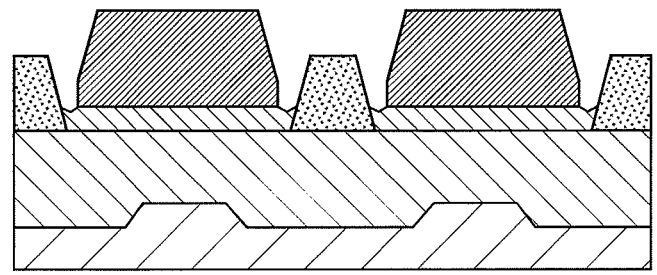
Figure 3C:
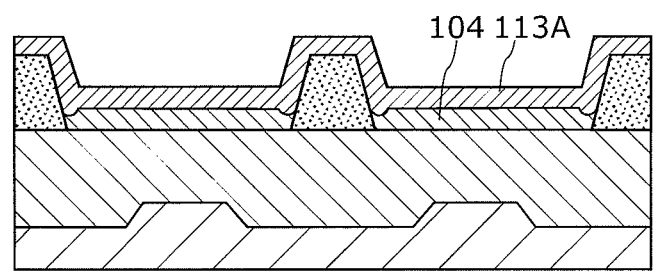

FIGS. 3A to 3C are process cross section views illustrating an example of the method of forming the pixel electrode 104.

First, a metal layer 104A made of a metal having a high reflectivity and high electric conductivity, such as aluminum and silver-palladium-copper alloys, is formed from the top surface of the bank 105 to the bottom of the opening. The metal layer 104A may be formed entirely on, for example, the planarizing layer 103 and the bank 105. On the metal layer 104A that is on the opening of the bank 105, a resist 104M is applied as illustrated in FIG. 3A.

The pixel electrode 104 is formed by etching the metal layer 104A using the resist 104M as a mask. The etching may be, for example, wet etching using a mixed solution of phosphate, nitric acid, and acetic acid, or dry etching using a chlorine-based gas.

For example, when the wet etching is used, a portion of the metal layer 104A that is not covered with the resist 104M is first removed to expose the top surface and a part of the side wall of the bank 105. Then, the etching solution enters a crevice between the resist 104M and a slope of the bank 105, so that distinctive depressed portions that open upward are formed on the pixel electrode 104 in the peripheral portion close to the end portion that is in contact with the side wall of the bank 105, as illustrated in FIG. 3B1. Similarly, when the dry etching is used, depressed portions sharper than those formed by the wet etching are formed in the peripheral portion of the pixel electrode 104 as illustrated in FIG. 3B2.

As illustrated in FIGS. 3B1 and 3B2, the shape of the pixel electrode 104 is characterized in that the end portion is in contact with the side wall of the bank 105 so as to run on the side wall, and by having depressed portions that open upward in the peripheral portion close to the end portion of the pixel electrode 104.

Next, the resist 104M is removed, and a layer 113A made of a material having the hole injection function, such as a tungsten oxide $WO_x$, an alloy of tungsten and molybdenum (WMo), and a nickel oxide (NiO) is formed, for example, entirely on the pixel electrode 104 with an area larger than that of the pixel electrode 104 as illustrated in FIG. 3C. Since the depressed portions formed on the pixel electrode 104 are covered with the layer 113A, no hollow is formed between the layers.

Again with reference to FIG. 2, the remaining manufacturing processes of the organic EL display panel device 100 will be described.

Figure 2D:
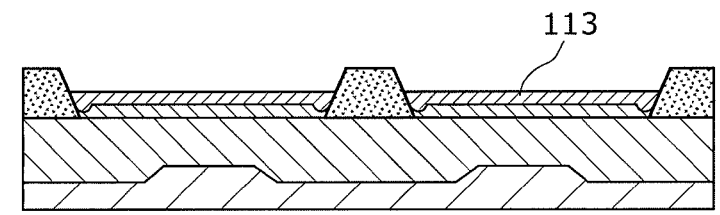

The layer 113A is etched to form the hole injection layer 113 having the area larger than that of the pixel electrode 104. The depressed portions formed on the pixel electrode 104 are covered with the hole injection layer 113 as illustrated in FIG. 2D.

Figure 2E:
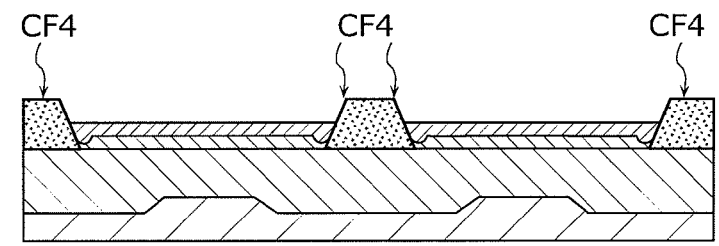

In order to improve adhesion between the bank 105 and the upper layers, a methane tetrafluoride (CF4) process is performed using the dry etching, and a water repellent process is performed by vapor coating hexamethyldisilazane (HMDS) or others, as illustrated in FIG. 2E.

Figure 2F:
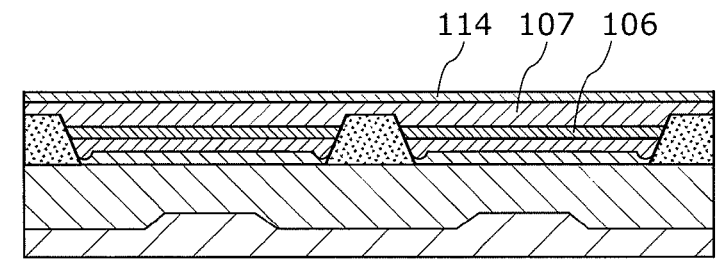

The organic EL layer 106 is formed by applying an organic material having the electroluminescence function, such as tris (8-hydroxyquinolinato) aluminium (Alq3), using an ink jet method. Then, the common electrode 107 and the sealing layer 114 are formed, and thus, the processes of manufacturing the organic EL display panel device 100 end as illustrated in FIG. 2F.

Embodiment 2

Next, an organic EL display panel device and a method of manufacturing the same according to Embodiment 2 will be described.

(Structure of Organic EL Display Panel Device)

Figure 4:
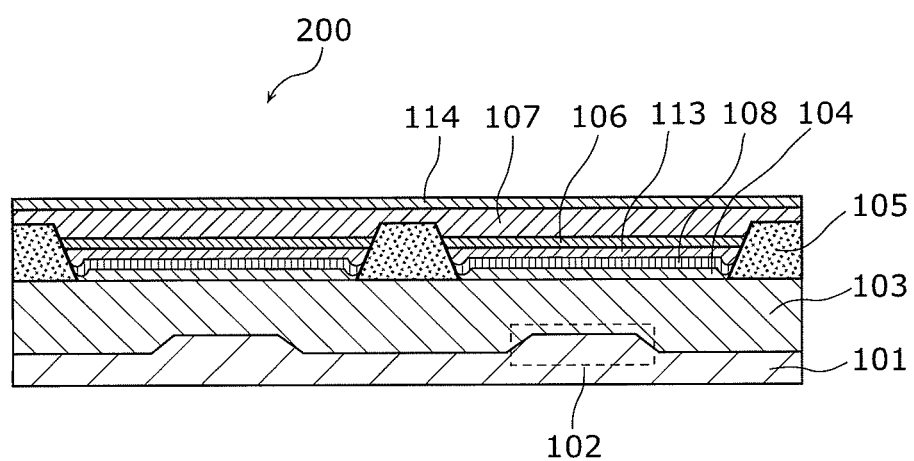
FIG. 4 illustrates a cross section of an example of a structure of main portions of an organic EL display panel device according to Embodiment 2.

FIG. 4 illustrates a cross section of an example of a structure of main portions of an organic EL display panel device 200 according to Embodiment 2 in the present invention. The organic EL display panel device 200 is an example of a display panel device according to the present invention. The organic EL display panel device 200 differs from the organic EL display panel device 100 according to Embodiment 1 in FIG. 1B by additionally including a transparent conductive layer 108 between the pixel electrode 104 and the hole injection layer 113.

The transparent conductive layer 108 interposed between the pixel electrode 104 and the hole injection layer 113 prevents oxidation of the pixel electrode 104 and improves the efficiency to extract light by adjustment of cavities. The depressed portions that open upward in the peripheral portion of the pixel electrode 104 is covered with the transparent conductive layer 108, and the transparent conductive layer 108 is covered with the hole injection layer 113.

(Method of Manufacturing Organic EL Display Panel Device)

Next, an example of the method of manufacturing the organic EL display panel device 200 according to Embodiment 2 in the present invention will be described. The method of manufacturing the organic EL display panel device 200 is an example of a method of manufacturing a display panel device according to the present invention.

The method differs from that for the organic EL display panel device 100 by additionally including a process of forming the transparent conductive layer 108. The common processes as those of the organic EL display panel device 100 will be omitted, and the differences will be mainly described hereinafter.

FIGS. 5A to 5D are process cross section views illustrating an example of essential processes of the method of manufacturing the organic EL display panel device 200. FIGS. 5A to 5D illustrate processes after forming a thin-film transistor layer 101 including a driving transistor 102, a planarizing layer 103, a bank 105, and a pixel electrode 104 according to the same processes as those for manufacturing the organic EL display panel device 100 (FIGS. 2A to 2C, FIGS. 3A to 3C).

Figure 5A:
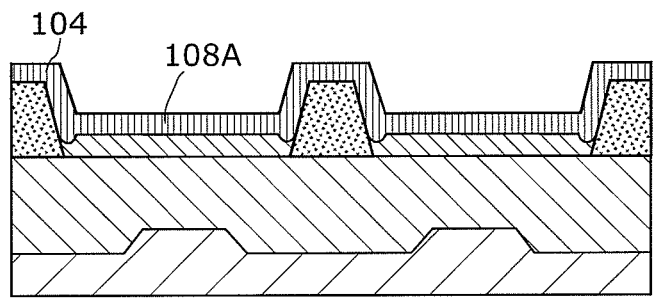
FIGS. 5A to 5D illustrate cross sections of an example of processes of manufacturing an organic EL display panel device according to Embodiment 2.

A transparent conductive layer 108A made of ITO, indium zinc oxide (IZO), and others is formed entirely on the pixel electrode 104 and the bank 105 as illustrated in FIG. 5A. Since the depressed portions formed in the peripheral portion of the pixel electrode 104 are covered with the transparent conductive layer 108A, no hollow is formed between the layers.

Figure 5B:
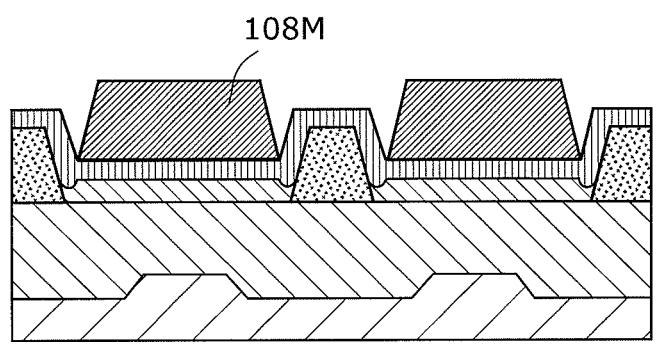
Figure 5C:
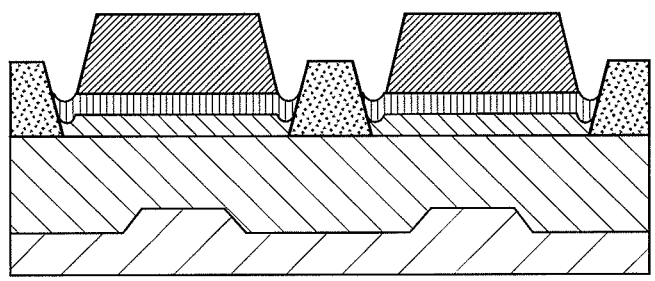

Next, on the opening of the bank 105 that is on the transparent conductive layer 108A, a resist 108M is applied as illustrated in FIG. 5B. The transparent conductive layer 108 is formed by etching the transparent conductive layer 108A using an etching solution, such as an oxalic acid and a hydrofluoric acid, and using the resist 108M as a mask as illustrated in FIG. 5C.

Figure 5D:
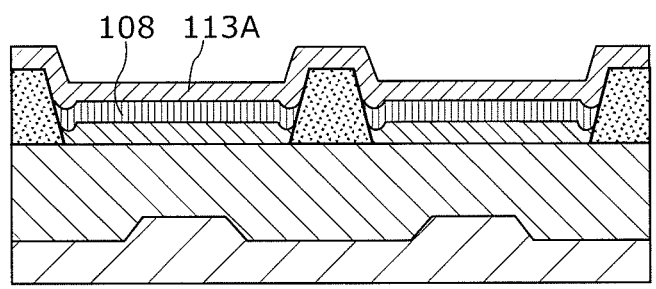

Next, the resist 108M is removed, and a layer 113A made of a material having the hole injection function, such as $WO_x$, WMo, and NiO is formed, for example, entirely on the transparent conductive layer 108 with an area larger than those of the pixel electrode 104 and the transparent conductive layer 108 as illustrated in FIG. 5D. Since the depressed portions formed on the transparent conductive layer 108 are covered with the layer 113A, no hollow is formed between the layers.

Then, the hole injection layer 113, the organic EL layer 106, the common electrode 107, and the sealing layer 114 are formed according to the same processes as the method of manufacturing the organic EL display panel device 100 (FIGS. 2D to 2F), and finally, the processes of manufacturing the organic EL display panel device 200 end.

According to the method of manufacturing the organic EL display panel device 200 in Embodiment 2, the pixel electrode 104 and the transparent conductive layer 108 are formed through two times of the photolithography for applying the resists 104M and 108M and two times of etching for patterning the metal layer 104A and the transparent conductive layer 108A.

Embodiment 3

Next, an organic EL display panel device and a method of manufacturing the same according to Embodiment 3 will be described.
(Structure of Organic EL Display Panel Device)

Figure 6:
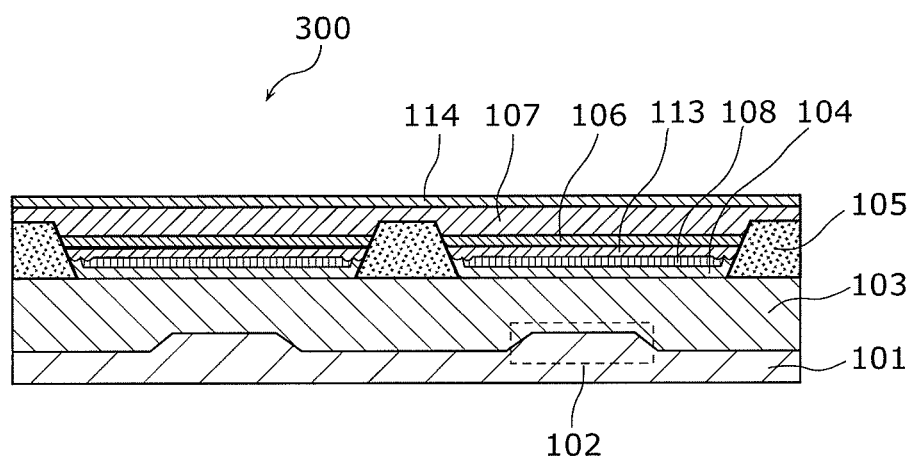
FIG. 6 illustrates a cross section of an example of a structure of an organic EL display panel device according to Embodiment 3.

FIG. 6 illustrates a cross section of an example of a structure of main portions of an organic EL display panel device 300 according to Embodiment 3 in the present invention. The organic EL display panel device 300 is an example of a display panel device according to the present invention. The organic EL display panel device 300 includes a transparent conductive layer 108 that is a transparent conductive film, between a pixel electrode 104 and a hole injection layer 113 as in the organic EL display panel device 200 according to Embodiment 2.

The transparent conductive layer 108 interposed between the pixel electrode 104 and the hole injection layer 113 prevents oxidation of the pixel electrode 104 and improves the efficiency to extract light by adjustment of cavities.

While the pixel electrode 104 and the transparent conductive layer 108 are formed by etching using different masks in the method of manufacturing the organic EL display panel device 200 according to Embodiment 2, the pixel electrode 104 and the transparent conductive layer 108 in the organic EL display panel device 300 are formed by etching using the same mask. Thus, the shapes of the end portions of the pixel electrode 104 and the transparent conductive layer 108 in the organic EL display panel device 300 are different from those of the organic EL display panel device 200.

The depressed portions that open upward are formed in the peripheral portion of the pixel electrode 104 and the transparent conductive layer 108 in the organic EL display panel device 300, and are covered with the hole injection layer 113.
(Method of Manufacturing Organic EL Display Panel Device)

Next, an example of the method of manufacturing the organic EL display panel device 300 according to Embodiment 3 in the present invention will be described. The method of manufacturing the organic EL display panel device 300 is an example of a method of manufacturing a display panel device according to the present invention.

The method differs from that of the organic EL display panel device 200 in the process of forming the pixel electrode 104 and the transparent conductive layer 108. The common processes as those of the method of manufacturing the organic EL display panel devices 100 and 200 will be omitted, and the differences will be mainly described hereinafter.

FIGS. 7A to 7E are process cross section views illustrating an example of essential processes of the method of manufacturing the organic EL display panel device 300. FIGS. 7A to 7E illustrate processes after forming a thin-film transistor layer 101 including a driving transistor 102, a planarizing layer 103, and a bank 105 according to the same processes as those for manufacturing the organic EL display panel device 100 (FIGS. 2A to 2B).

Figure 7A:
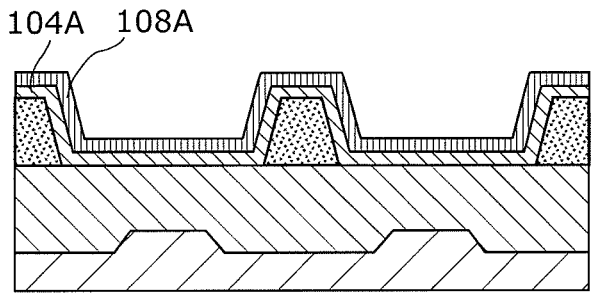
FIGS. 7A to 7E illustrate cross sections of an example of processes of manufacturing an organic EL display panel device according to Embodiment 3.

First, a metal layer 104A made of a metal having a high reflectivity and high electric conductivity, such as aluminum and a silver-palladium-copper alloy, is formed from the top surface of the bank 105 to the bottom of the opening. The metal layer 104A may be formed entirely on, for example, the planarizing layer 103 and the bank 105. Then, a transparent conductive layer 108A made of ITO, indium zinc oxide (IZO), and others is formed before patterning the pixel electrode 104 as illustrated in FIG. 7A.

Figure 7B:
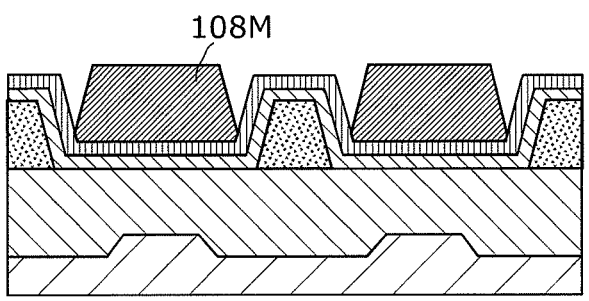
Figure 7C:
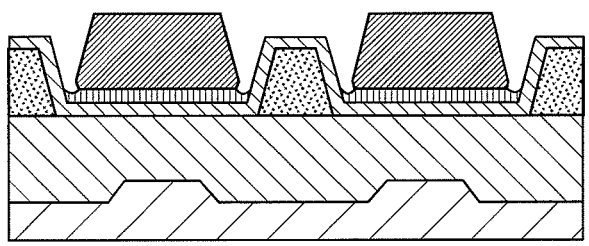
Figure 7D:
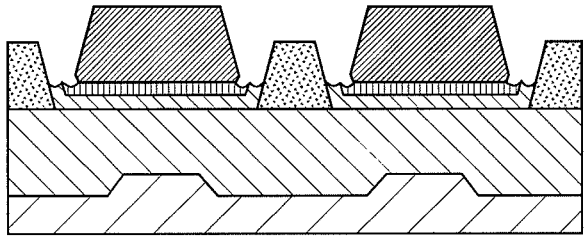

On the opening of the bank 105 that is on the transparent conductive layer 108A, a resist 108M is applied as illustrated in FIG. 7B. The transparent conductive layer 108 is formed by etching the transparent conductive layer 108A using an etching solution, such as oxalic acid and using the resist 108M as a mask, as illustrated in FIG. 7C. Next, the pixel electrode 104 is formed, using the resist 108A as the mask, by wet etching, for example, using a mixed solution of phosphate, nitric acid, and acetic acid, or by dry etching, for example, using a chlorine-based gas, as illustrated in FIG. 7D.

Figure 7E:
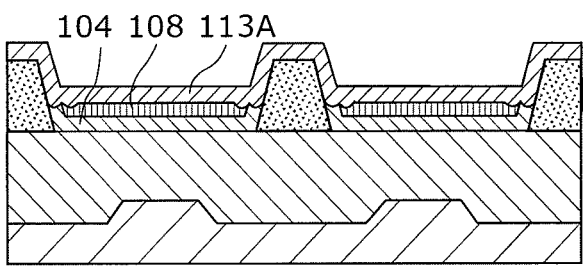
Figure 8A:
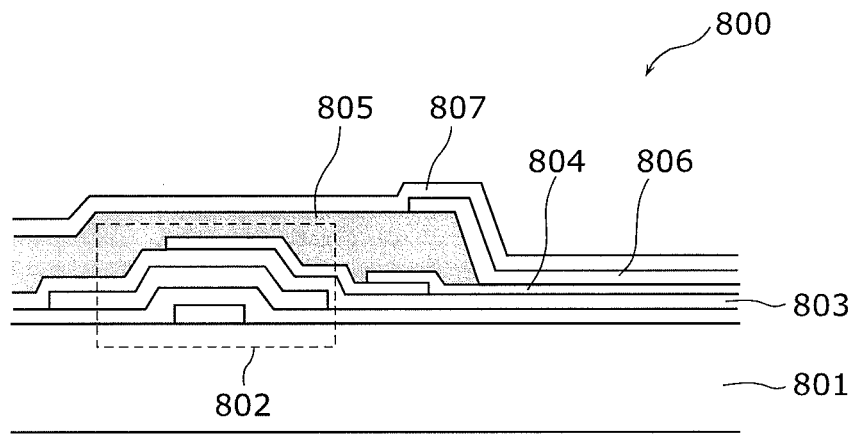
FIGS. 8A and 8B illustrate respective cross sections of examples of structures of conventional organic EL display devices.
Figure 8B:
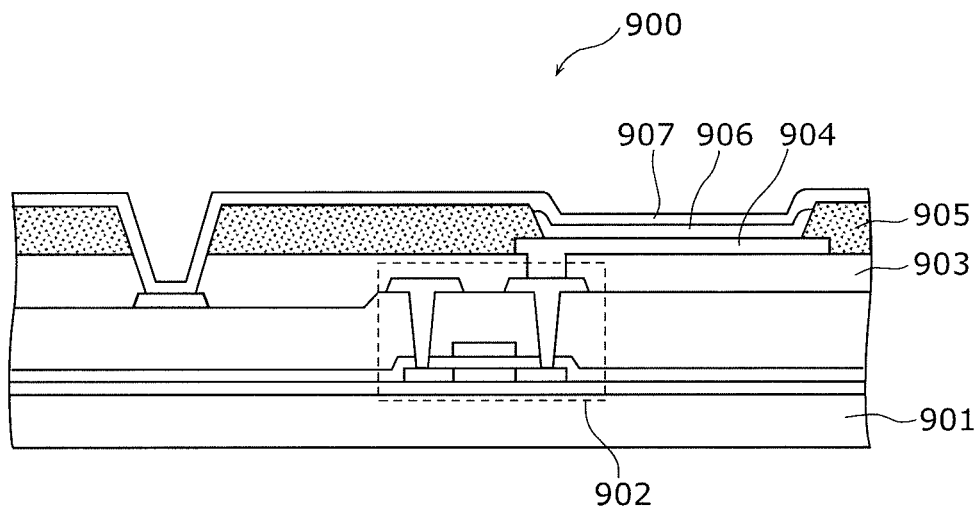
Figure 9A:
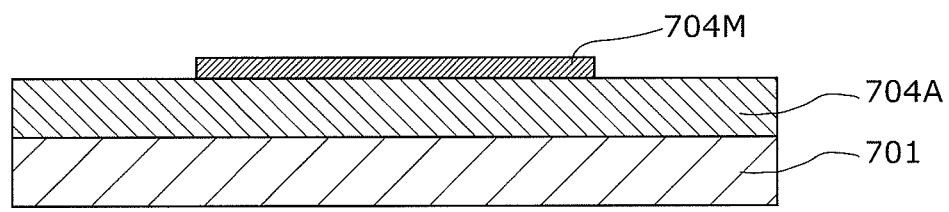
FIGS. 9A and 9C illustrate a problem of a conventional organic EL display device.
Figure 9B:
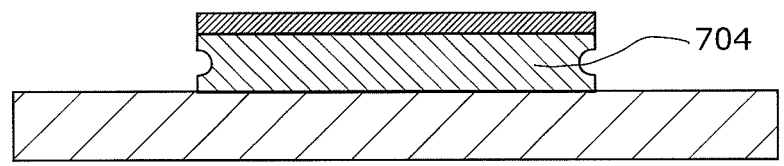
Figure 9C:
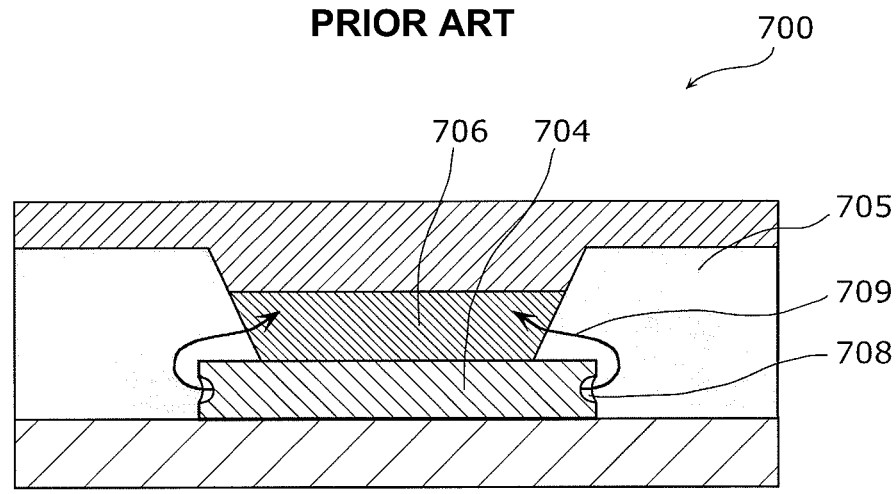

Next, the resist 108M is removed, and a layer 113A made of a material having the hole injection function, such as $WO_x$, WMo, and NiO is, for example, entirely formed on the transparent conductive layer 108 with an area larger than that of the pixel electrode 104 and the transparent conductive layer 108, as illustrated in FIG. 7E. Since the depressed portions formed on the transparent conductive layer 108 and the pixel electrode 104 are covered with the layer 113A, no hollow is formed between the layers.

Then, a hole injection layer 113, an organic EL layer 106, a common electrode 107, and a sealing layer 114 are formed according to the same processes as the method of manufacturing the organic EL display panel device 100 (FIGS. 2D to 2F), and finally, the processes of manufacturing the organic EL display panel device 300 end.

According to the method of manufacturing the organic EL display panel device 300 in Embodiment 3, the pixel electrode 104 and the transparent conductive layer 108 are formed through one time of the photolithography for applying the resists 108M and two times of etching for patterning the pixel electrode 104 and the transparent conductive layer 108A.

(Variation)

Although the display panel device and the method of manufacturing the same according to the present invention are described hereinbefore using the examples of the organic EL display panel devices based on Embodiments 1 to 3, the present invention is not limited to Embodiments 1 to 3. Without departing from the scope of the present invention, the present invention includes an embodiment with some modifications on Embodiments 1 to 3 that are conceived by a person skilled in the art.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

The display panel device according to the present invention is available as any display device included in television sets, mobile phones, personal computers, and others.

What is claimed is:

1. A display panel device, comprising:
   a bank and an opening surrounded by an inclined side wall of said bank;
   a first electrode layer formed on said opening of said bank;
   an organic functional layer formed on said first electrode layer; and
   a second electrode layer formed on said organic functional layer,
   wherein said first electrode layer has (i) an end portion that is in contact with the side wall of said bank so that the end portion runs on the side wall, and (ii) a depressed portion that opens upward in a peripheral portion close to the end portion.

2. The display panel device according to claim 1, wherein the depressed portion that opens upward in the peripheral portion of said first electrode layer is covered with said organic functional layer formed on said first electrode layer.

3. The display panel device according to claim 1, wherein said first electrode layer is a metal layer.

4. The display panel device according to claim 3, further comprising
   a transparent conductive layer interposed between said first electrode layer and said organic functional layer, said transparent conductive layer preventing oxidation of said first electrode layer,
   wherein the depressed portion that opens upward in the peripheral portion of said first electrode layer is covered with said transparent conductive layer.

5. The display panel device according to claim 1, wherein said first electrode layer is a transparent conductive layer.

6. The display panel device according to claim 1, wherein said organic functional layer includes an organic electroluminescence (EL) layer.

7. The display panel device according to claim 1, wherein said first electrode layer is a metal anode layer, said second electrode layer is a metal cathode layer, and said organic functional layer includes an organic EL layer and a hole injection layer.

8. The display panel device according to claim 1, wherein said first electrode layer is a metal anode layer, said second electrode layer is a metal cathode layer, and said organic functional layer includes an organic EL layer, a hole transport layer, and a hole injection layer.

9. The display panel device according to claim 1, further comprising:
   a thin-film transistor layer that includes a driving transistor and is located below said first electrode layer, said driving transistor causing an organic EL layer included in said organic functional layer to produce a luminescence with application of a current between said first electrode layer and said second electrode layer; and
   a planarizing layer located between said organic EL layer and said thin-film transistor layer to planarize an interface between said organic EL layer and said thin-film transistor layer.

10. The display panel device according to claim 9, wherein said planarizing layer and said bank are formed of different materials.

11. The display panel device according to claim 9, wherein said planarizing layer and said bank are formed of a same material and in a same layer.

12. A display device including the display panel device according to claim 1,
   wherein the display device is used in one of a television, mobile device, or personal computer.

13. A method of manufacturing a display panel device, comprising:
   forming, on a base, a bank and an opening surrounded by an inclined side wall of the bank;
   forming a first electrode layer from a top surface of the bank to a bottom of the opening, using a thin film formation method;
   patterning the first electrode layer by etching so that the first electrode layer has a depressed portion that opens upward in a peripheral portion close to an end portion of the first electrode layer, the end portion of the first electrode layer being continuously in contact with the side wall of the bank;
   forming a layer above the first electrode layer so as to cover the depressed portion that opens upward; and
   forming a second electrode layer above the first electrode layer.

14. The method according to claim 13, wherein in said forming of a layer, the layer formed above the first electrode layer has an area larger than an area of the first electrode layer, and covers the depressed portion that opens upward in the peripheral portion of the first electrode layer.

15. The method according to claim 13, wherein in said forming of a layer, the layer covering the depressed portion of the first electrode layer is an organic functional layer.

16. The method according to claim 14, wherein a transparent conductive layer is formed on the first electrode layer after said forming of a first electrode layer and before said patterning, and
   in said patterning, a resist is applied by photolithography at a predetermined position of the transparent conductive layer, the transparent conductive layer is patterned by first etching using the resist as a mask, and the first electrode layer is further patterned by second etching using the resist as the mask.

17. The method according to claim 13, wherein in said forming of a layer, the layer covering the depressed portion of the first electrode layer is a transparent conductive layer that prevents oxidation of the first electrode layer, and said method further comprises forming an organic functional layer between the transparent conductive layer and the second electrode layer.

18. The method according to claim 17, wherein in said patterning, a first resist is applied by photolithography at a predetermined position of the first electrode layer, and the first electrode layer is patterned using the first resist as a mask, and in said forming of a layer, the first resist is removed, the transparent conductive layer is formed so as to cover the patterned first electrode layer, a second resist is applied by photolithography at a predetermined position of the transparent conductive layer, and the transparent conductive layer is patterned by etching using the second resist as a mask.

19. The method according to claim 13, wherein said forming of a first electrode layer and said patterning are performed in a same process, and a planarizing layer and the bank are formed of a same material and in a same layer.

20. The method according to claim 13, wherein the thin film formation method is a sputtering method.

21. The method according to claim 13, wherein the first electrode layer is a metal anode layer, the second electrode layer is a metal cathode layer, the organic functional layer includes an organic EL layer and a hole injection layer that injects holes from the metal anode layer into the organic EL layer, and the hole injection layer is formed using the thin film formation method, and the organic EL layer is formed by applying an organic material using an ink jet method.

22. The method according to claim 13, wherein in said patterning, the end portion of the first electrode layer is in contact with the side wall of the bank so as to run on the side wall.

* * * * *